United States Patent
Furuie

(10) Patent No.: US 10,141,389 B2
(45) Date of Patent: Nov. 27, 2018

(54) DISPLAY DEVICE

(71) Applicant: Japan Display Inc., Minato-ku (JP)

(72) Inventor: Masamitsu Furuie, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/663,974

(22) Filed: Jul. 31, 2017

(65) Prior Publication Data

US 2018/0069071 A1    Mar. 8, 2018

(30) Foreign Application Priority Data

Sep. 5, 2016   (JP) ................................. 2016-172487

(51) Int. Cl.
  *H01L 27/32*   (2006.01)
  *H01L 51/00*   (2006.01)
  *H01L 51/52*   (2006.01)

(52) U.S. Cl.
  CPC ...... *H01L 27/3276* (2013.01); *H01L 51/0097* (2013.01); *H01L 51/5237* (2013.01); *H01L 2251/5338* (2013.01)

(58) Field of Classification Search
  CPC ............ H01L 27/3276; H01L 51/0097; H01L 51/5237
  USPC ........................................................ 257/88
  See application file for complete search history.

(56) References Cited

U.S. PATENT DOCUMENTS

| | | | |
|---|---|---|---|
| 2014/0098095 A1* | 4/2014 | Lee | G06F 3/041 |
| | | | 345/420 |
| 2016/0007441 A1 | 1/2016 | Matsueda | |
| 2017/0336831 A1* | 11/2017 | Zhang | G06F 3/0416 |

FOREIGN PATENT DOCUMENTS

| | | | | |
|---|---|---|---|---|
| EP | 2 538 760 A1 * | 6/2011 | ............... | H05K 1/14 |
| EP | 2 538 760 A1 * | 12/2012 | ............... | H05K 1/14 |
| JP | 2015-152816 | 8/2015 | | |
| JP | 2016-015618 | 1/2016 | | |

* cited by examiner

Primary Examiner — Moazzam Hossain
Assistant Examiner — Warren H Kilpatrick
(74) Attorney, Agent, or Firm — Oblon, McClelland, Maier & Neustadt, L.L.P.

(57) ABSTRACT

A display device includes: a flexible substrate having a shape extending in a first direction and a second direction crossing each other; a display element layer in which light-emitting elements are arranged; a sealing layer sealing the display element layer; and wires each including a first portion extending in the first direction and exhibiting a shape-memory effect, the wires being divided into groups depending on which the position of the first portion in the first direction is different. The wire of at least one group further includes a second portion not exhibiting the shape-memory effect and extending in the first direction from the first portion so as to approach an edge of the flexible substrate. The wires are energized and heated in ascending or descending order of distance of the positions of the first portions from the edge of the flexible substrate.

4 Claims, 10 Drawing Sheets

DISPLAY DEVICE

CROSS-REFERENCE TO RELATED APPLICATION

The present application claims priority from Japanese application JP2016-172487 filed on Sep. 5, 2016, the content of which is hereby incorporated by reference into this application.

BACKGROUND OF THE INVENTION

1. Field of the Invention

The present invention relates to a display device.

2. Description of the Related Art

Flexible displays having a structure in which a display element is stacked on a bendable flexible substrate have been developed. As disclosed in JP 2016-015618 A, when the flexible display is configured to be foldable for carrying it, it is easy to carry the flexible display. Moreover, when the display is configured such that the opening and closing thereof can be electrically performed, the configuration is convenient when both hands are occupied, and this is possible by using, for example, wires made of a shape-memory alloy.

The shape-memory alloy has the property of returning to its original shape by heat. JP 2015-152816 A discloses that a wire whose original shape is bent and a wire whose original shape is straight are both used to enable the rolling and development of the display. However, the display may not be brought into a shape suitable for storage by an action in which the entire display is simultaneously deformed.

SUMMARY OF THE INVENTION

It is an object of the invention to properly deform a display device.

A display device according to an aspect of the invention includes: a flexible substrate having a shape extending in a first direction and a second direction crossing each other; a display element layer in which a plurality of light-emitting elements are arranged; a sealing layer sealing the display element layer; and a plurality of wires each including a first portion extending in the first direction and exhibiting a shape-memory effect, the plurality of wires being divided into a plurality of groups depending on which the position of the first portion in the first direction is different, wherein the wire of at least one group further includes a second portion not exhibiting the shape-memory effect and extending in the first direction from the first portion so as to approach an edge of the flexible substrate, and the plurality of wires are energized and heated in ascending or descending order of distance of the positions of the first portions from the edge of the flexible substrate.

According to the aspect of the invention, the plurality of wires include the first portions exhibiting the shape-memory effect at different positions in the first direction. Hence, the display device can be properly deformed by deforming the flexible substrate portion by portion.

DETAILED DESCRIPTION OF THE INVENTION

Figure 1:
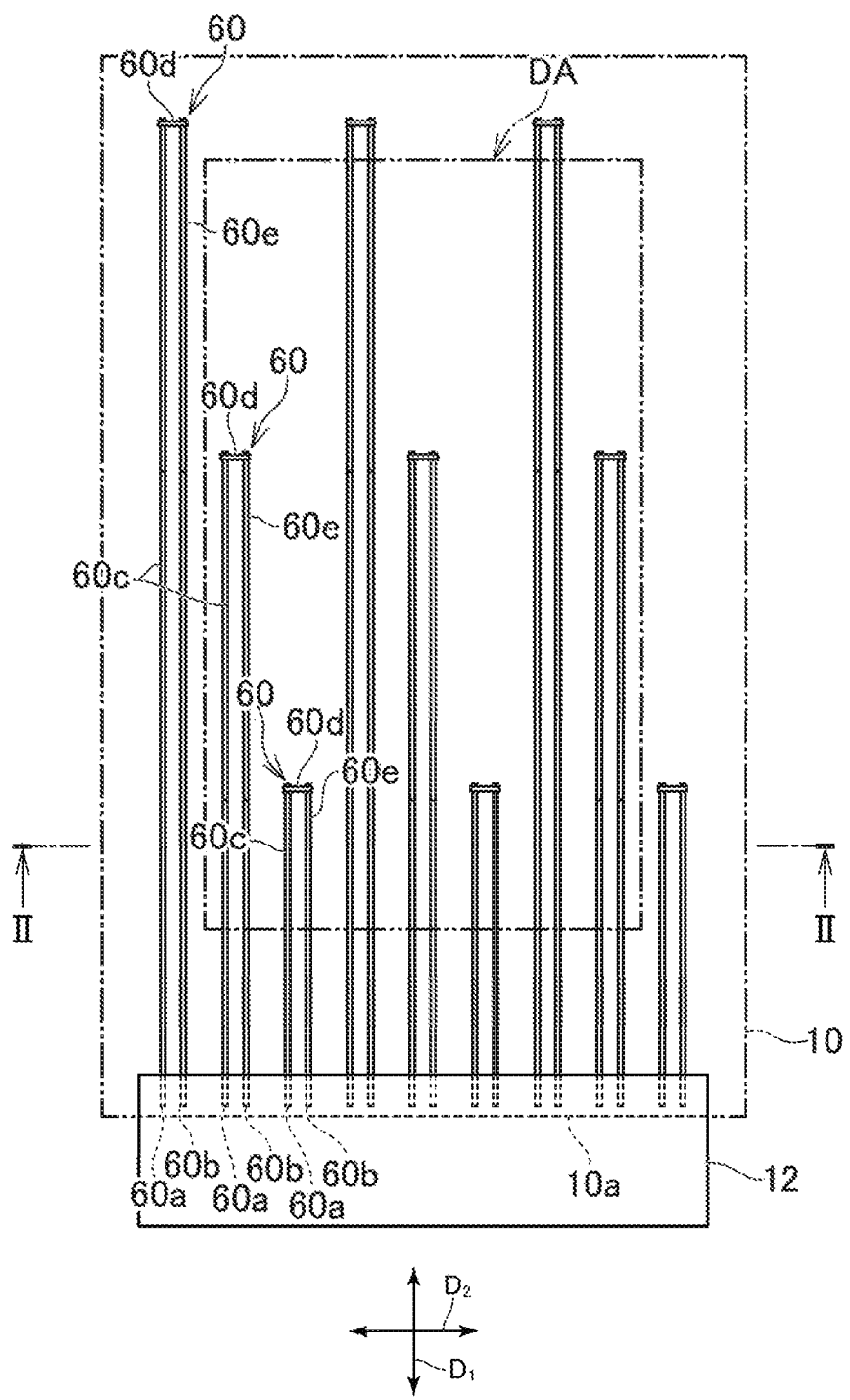
FIG. 1 is a plan view of a display device according to a first embodiment of the invention.

Hereinafter, embodiments of the invention will be described with reference to the drawings. However, the invention can be implemented in various aspects within the scope not departing from the gist thereof, and should not be interpreted as being limited to the details described in the following exemplary embodiments.

In the drawings, the width, thickness, shape, and the like of each part may be schematically represented, compared to those in practicing aspects of the invention, for more clarity of description. However, they are illustrative only and do not limit the interpretation of the invention. In the specification and the drawings, elements having functions similar to those described in relation to a previous drawing are denoted by the same reference numerals and signs, and a redundant description may be omitted.

Further, in the detailed description of the invention, the terms "on" and "below" as used in defining the positional relationship between one component and another component include, not only the case where one component is located directly on or directly below another component, but also the case where still another component intervenes between the components unless otherwise noted.

[First Embodiment]

FIG. 1 is a plan view of a display device according to a first embodiment of the invention. As the display device, an organic electroluminescent display device is exemplified. The display device is configured such that, for example, unit pixels (sub-pixels) of multiple colors of red, green, and blue are combined to form a full-color pixel and that a full-color image is displayed in a display area DA. The display device includes a flexible substrate 10 having a shape extending in a first direction D1 and a second direction D2 crossing each other. A flexible printed board 12 is connected to the flexible substrate 10 for electrical connection to the outside.

Figure 2:
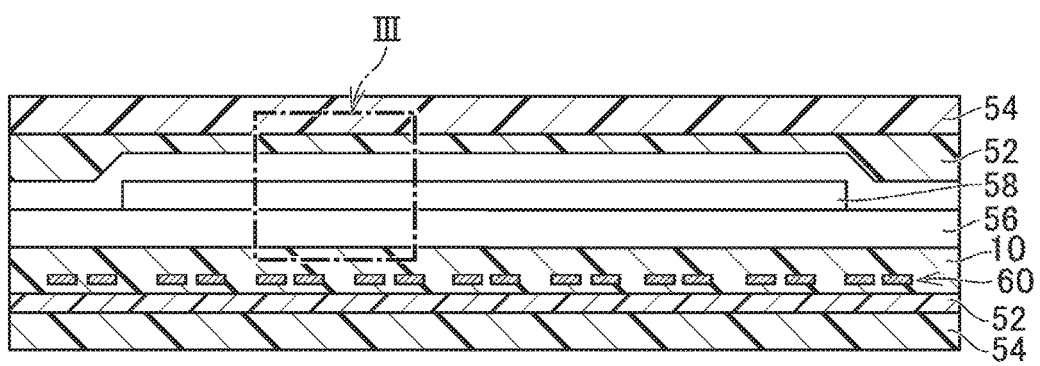
FIG. 2 is a cross-sectional view of the display device shown in FIG. 1, taken along line II-II.
Figure 3:
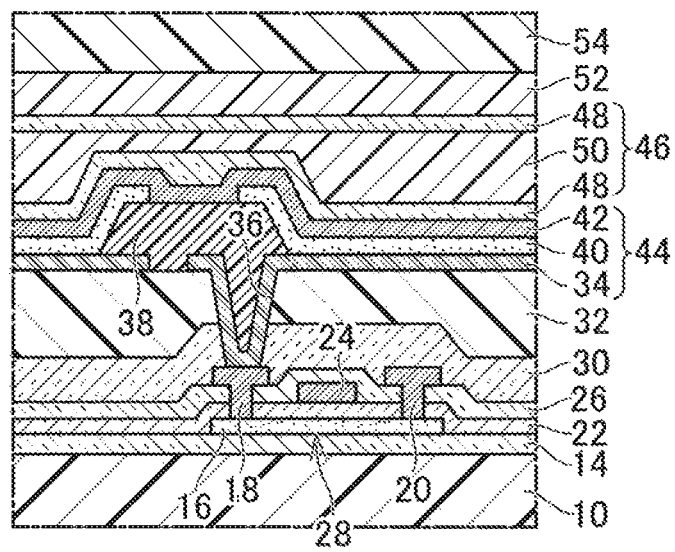
FIG. 3 is an enlarged view of a portion indicated by III in FIG. 2.

FIG. 2 is a cross-sectional view of the display device shown in FIG. 1, taken along line II-II. FIG. 3 is an enlarged view of a portion indicated by III in FIG. 2. The flexible substrate 10 is made of polyimide resin, polyethylene terephthalate, or the like. An undercoat layer 14 serving as a barrier to impurities contained in the flexible substrate 10 itself is formed on the flexible substrate 10. The undercoat layer 14 is formed of a silicon oxide film, a silicon nitride film, or the like, and may be a stacked structure of these films. A semiconductor layer 16 is formed on the undercoat layer 14. A source electrode 18 and a drain electrode 20 are electrically connected to the semiconductor layer 16, and a gate insulating film 22 is formed to cover the semiconductor layer 16. A gate electrode 24 is formed on the gate insulating film 22, and an inter-layer insulating film 26 is formed to cover the gate electrode 24. The source electrode 18 and the drain electrode 20 penetrate the gate insulating film 22 and the inter-layer insulating film 26. The semiconductor layer 16, the source electrode 18, the drain electrode 20, and the gate electrode 24 constitute a thin film transistor 28. A passivation film 30 is provided so as to cover the thin film transistor 28.

A planarization layer 32 is provided on the passivation film 30. A plurality of pixel electrodes 34 (e.g., anodes) configured so as to correspond to the plurality of unit pixels (sub-pixels) are provided on the planarization layer 32. The planarization layer 32 is formed such that at least the surface on which the pixel electrode 34 is provided is flat. As the planarization layer 32, an organic material such as photosensitive acrylic resin is used in many cases. The pixel electrode 34 is electrically connected to one of the source electrode 18 and the drain electrode 20 on the semiconductor layer 16 through a contact hole 36 penetrating the planarization layer 32 and the passivation film 30.

An insulating layer 38 is formed on the planarization layer 32 and the pixel electrode 34. The insulating layer 38 is formed so as to lie on the peripheral edge of the pixel electrode 34 and open a portion (e.g., a central portion) of the pixel electrode 34. The insulating layer 38 forms a bank surrounding a portion of the pixel electrode 34.

A light-emitting layer 40 is provided on the pixel electrode 34. The light-emitting layer 40 is provided individually (separately) for each of the pixel electrodes 34, and also lies on the insulating layer 38. In this case, the light-emitting layers 40 emit blue, red, and green light corresponding to the respective pixels. The colors corresponding to the pixels are not limited to them, and may include, for example, yellow and white. The light-emitting layer 40 is formed by, for example, vapor deposition. The light-emitting layer 40 may be formed so as to extend over the plurality of pixels on the entire surface covering the display area DA (see FIG. 1). That is, the light-emitting layer 40 maybe formed so as to be contiguous on the insulating layer 38. In this case, the light-emitting layer 40 is formed by application by solvent dispersion. When the light-emitting layer 40 is formed so as to extend over the plurality of pixels, the display device is configured such that the light-emitting layer 40 emits white light in all of the sub-pixels and that a desired color wavelength portion is extracted through a color filter (not shown).

A counter electrode 42 (a common electrode or a cathode) is provided on the light-emitting layer 40. The counter electrode 42 lies on the insulating layer 33 serving as a bank. A light-emitting element 44 including the light-emitting layer 40, and the pixel electrode 34 and the counter electrode 42 interposing the light-emitting layer 40 therebetween is configured. Each of the plurality of pixels includes the light-emitting element 44. The light-emitting layer 40 is interposed between the pixel electrode 34 and the counter electrode 42, and emits light with a luminance controlled by an electric current flowing therebetween. At least one layer of a hole transport layer and a hole injection layer (both not shown) may be provided between the light-emitting layer 40 and the pixel electrode 34. At least one layer of an electron transport layer and an electron injection layer (both not shown) may be provided between the light-emitting layer 40 and the counter electrode 42.

The light-emitting element 44 is covered and thus sealed by a sealing layer 46 stacked on the counter electrode 42, so that the light-emitting element 44 is shielded from moisture. The sealing layer 46 includes at least one layer of inorganic insulating layer 48 made of SiN or the like, and may have a stacked structure. For example, the sealing layer 46 may have a structure as shown in FIG. 3, in which at least one layer of organic insulating layer 50 made of resin or the like is interposed between a pair of inorganic insulating layers 48. The sealing layer 46 covers the display area DA (see FIG. 1).

A film 54 is attached to each of the sealing layer 46 and the flexible substrate 10 via an adhesive layer 52. The film 54 is made of polyethylene terephthalate, cycloolefin polymer resin, cycloolefin copolymer resin, or the like.

As shown in FIG. 2, the display device includes a plurality of layers stacked on one another. A circuit layer 56 for controlling the plurality of light-emitting elements 44 is stacked on the flexible substrate 10. A display element layer 58 in which the plurality of light-emitting elements 44 are arranged is stacked on the circuit layer 56. The plurality of layers include the sealing layer 46 to seal the display element layer 58.

The display device includes a plurality of wires 60. The wires 60 are provided within the flexible substrate 10 or at an interface between the flexible substrate 10 and an adjacent layer (within the flexible substrate 10 in FIG. 2). As shown in FIG. 1, both ends 60a and 60b of the wire 60 are located adjacent to each other. The both ends 60a and 60b of the wire 60 are located at an edge 10a of the flexible substrate 10. The wire 60 includes an outbound portion 60c linearly extending a long the first direction D1 from one end 60a. The wire 60 includes a connection portion 60d extending in the second direction D2 from the outbound portion 60c. The wire 60 includes an inbound portion 60e linearly reaching another edge 10b along the first direction D1 from the connection portion 60d.

Figure 4:
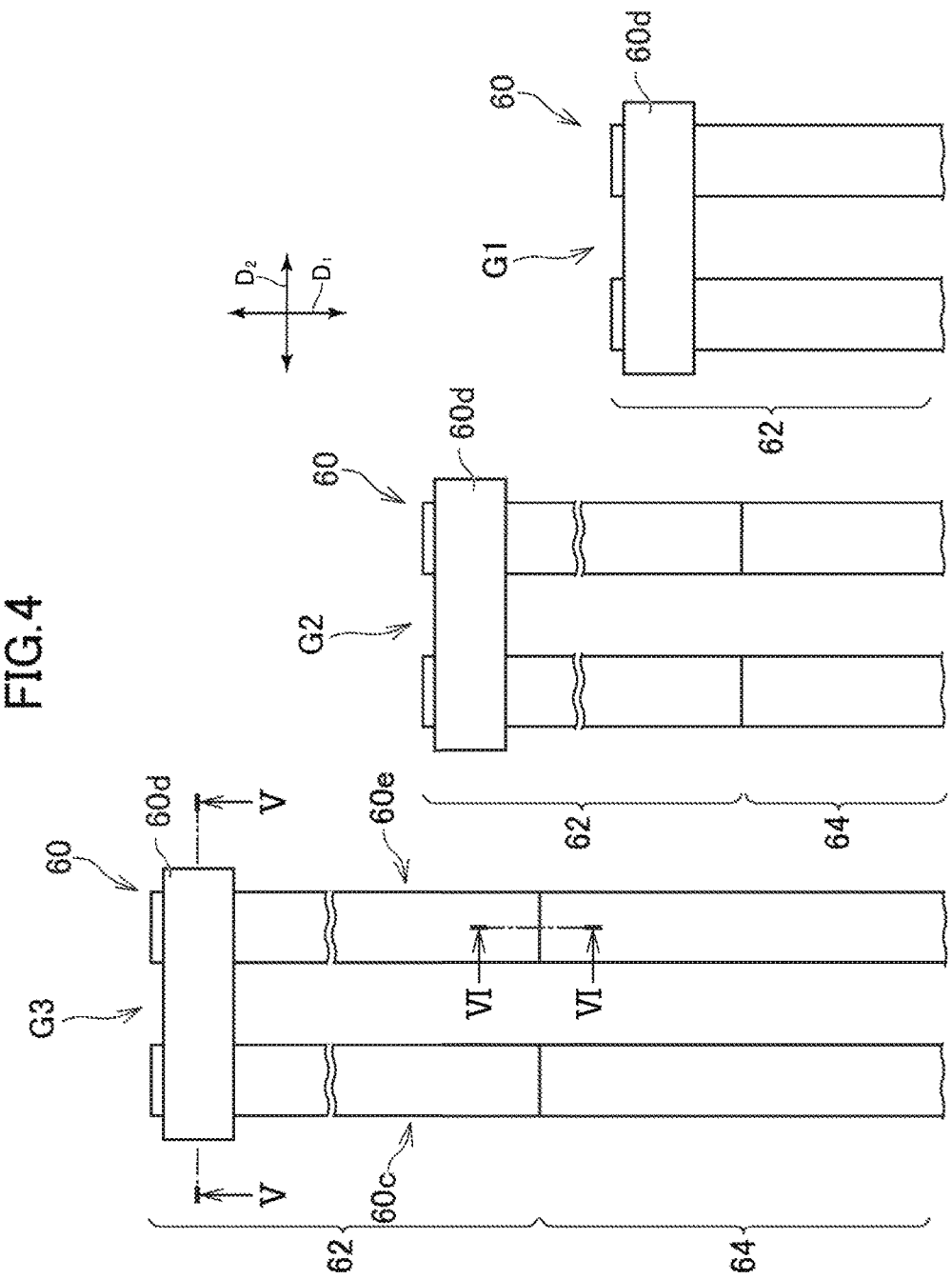
FIG. 4 is a diagram showing the details of a plurality of wires.
Figure 5:
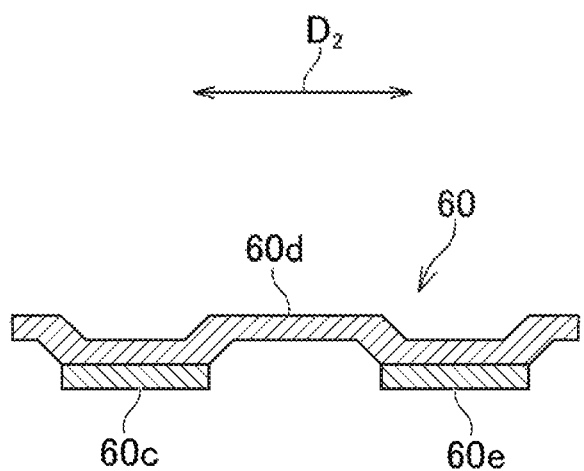
FIG. 5 is a cross-sectional view of the wire shown in FIG. 4, taken along line V-V.

FIG. 4 is a diagram showing the details of the plurality of wires. FIG. 5 is a cross-sectional view of the wire shown in FIG. 4, taken along line V-V. As shown in FIG. 5, the outbound portion 60c and the inbound portion 60e are adjacent to each other in the second direction D2 in the same layer, and the connection portion 60d is stacked on the outbound portion 60c and the inbound portion 60e.

As shown in FIG. 4, the wire 60 includes a first portion 62 extending in the first direction D1 and exhibiting a shape-memory effect. The first portion 62 is at least a portion of each of the outbound portion 60c and the inbound portion 60e, and includes a portion (portion shown in FIG. 5) overlapping the connection portion 60d. The plurality of wires 60 are arranged in parallel in the second direction D2. The positions of the first portions 62 of the wires 60 closest adjacent to each other in the second direction D2 are different (shifted) from each other in the first direction D1. The plurality of wires 60 are divided into a plurality of groups G1, G2, and G3 depending on which the position of the first portion 62 in the first direction D1 is different.

The first portion 62 of the wire 60 of any of the groups and the first portion 62 of the wire 60 of another group are partially adjacent to each other in the second direction D2. For example, the portions overlapping the connection portion 60d in the adjacent first portions 62 of the wire 60 of the group G1 are arranged so as to overlap portions (ends on the side opposite to the connection portion 60d) of the first portions 62 of the wire 60 of the group G2 in the second direction D2.

Figure 6:
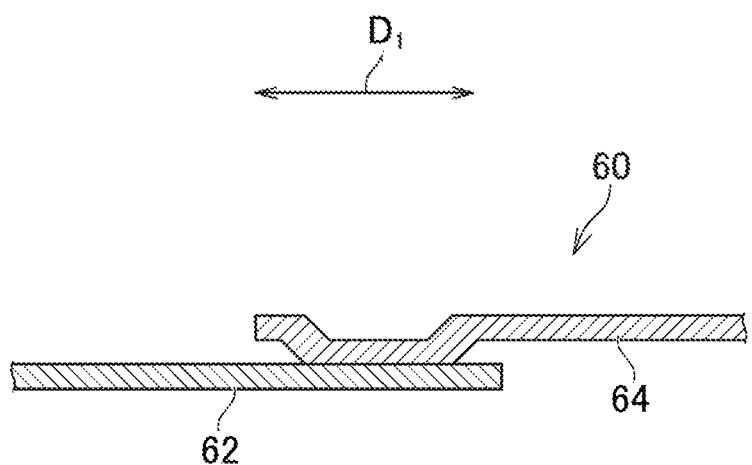
FIG. 6 is a cross-sectional view of the wire shown in FIG. 4, taken along line VI-VI.

FIG. 6 is a cross-sectional view of the wire 60 shown in FIG. 4, taken along line VI-VI. The wire 60 of at least one group G2 or G3 includes a second portion 64 extending in the first direction D1 from the first portion 62 so as to approach the edge 10a (see FIG. 1) of the flexible substrate 10. An end of the second portion 64 lies on an end of the first portion 62. The second portion 64 does not exhibit the shape-memory effect. The wire 60 of at least another group G1 does not include the second portion 64 extending in the first direction D1 from the first portion 62.

The first portion 62 remembers one of an extended state (a straightly extended state) and a bent state (a bent state with a front surface on which an image is displayed being inside or a bent state with a back surface being inside). In the case where the first portion 62 remembers the bent state, even if the first portion 62 is straightly extended at or below a certain temperature (transformation point), the first portion 62 recovers the original shape (bent state) when it is heated to or above the temperature. Alternatively, in the case where the first portion 62 remembers the extended state, even if the first portion 62 is bent at or below a certain temperature (transformation point), the first portion 62 recovers the original shape (straightly extended state) when it is heated to or above the temperature.

As the material of the first portion 62, a NiTi alloy (a NiTiCo alloy, a NiTiCu alloy, etc.), a CuZnAl alloy, or the like can be used. In order for the first portion 52 to remember the shape, a heat treatment is performed such that the first portion 62 is heated to a temperature higher than a critical temperature to once clear the memory and is then kept in a shape to remember at a temperature lower than the critical temperature for a relatively long time. The alloy is sufficiently ordered by the heat treatment, whereby the alloy can remember the shape. The shape recovery temperature is from 40 to 100° C., and preferably from 40 to 70° C. The wire 60 is provided so as to be energized and heated. Therefore, as shown in FIG. 1, the flexible printed board 12 is connected to the flexible substrate 10 for electrical connection to the outside.

According to the embodiment, the plurality of wires 60 include the first portions 62 exhibiting the shape-memory effect at different positions in the first direction D1 as shown in FIG. 4. Hence, the display device can be deformed into a shape suitable for storage or a shape suitable for looking and listening by deforming the flexible substrate 10 portion by portion.

FIGS. 7A to 7D are diagrams for explaining a first example of the shape change of a display device according to an embodiment of the invention. A display device 100 is attached to a housing 66 with the flexible printed board 12 shown in FIG. 1.

Figure 7A:
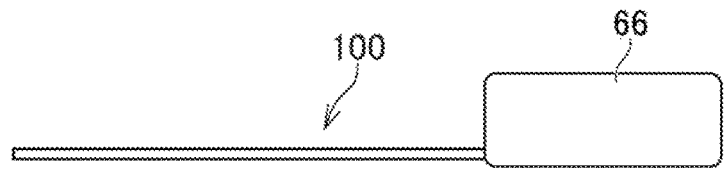
FIGS. 7A to 7D are diagrams for explaining a first example of the shape change of a display device according to an embodiment of the invention.

FIG. 7A shows a state where the display device 100 is developed. In this example, the plurality of wires 60 are energized and heated in ascending order of distance of the positions of the first portions 62 (FIG. 4) from the edge 10a (FIG. 1) of the flexible substrate 10 in the first direction D1. The first portion 62 remembers the bent state. When an electric current is fed from the flexible printed board 12 to the wire 60, the first portion 62 is heated by Joule heat. Since the first portion 62 remembers the bent state, the first portion 62 is bent by heat from the extended state. With this configuration, the display device 100 can be brought into an easy-to-carry shape by folding or rolling the display device 100.

Figure 7B:
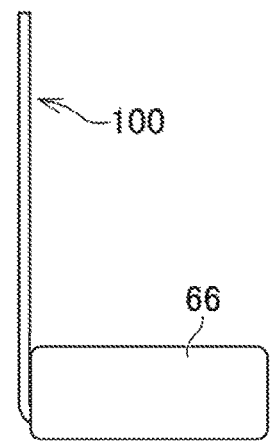

As shown in FIG. 7B, the wire 60 (FIG. 4) of the group G1 of the flexible substrate 10 is energized and heated. With this configuration, the flexible substrate 10 is bent at a portion where the wire 60 energized is located, but remains extended at the other portions. The display device 100 is bent along the surface of the housing 66 only at a portion close to the housing 66.

Figure 7C:
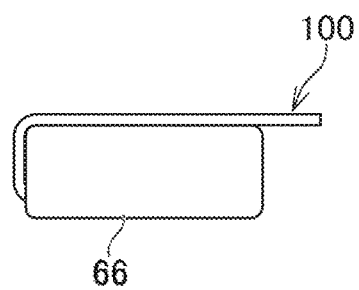

As shown in FIG. 7C, the wire 60 (FIG. 4) of the group G2 whose first portions 62 are second closest to the edge 10a of the flexible substrate 10 is energized and heated. With this configuration, the flexible substrate 10 is further bent, and the display device 100 is further bent along the surface of the housing 66.

Figure 7D:
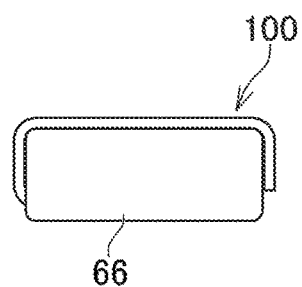

As shown in FIG. 7D, the wire 60 (FIG. 4) of the group G3 whose first portions 62 are farthest from the edge 10a of the flexible substrate 10 is energized and heated. With this configuration, the display device 100 is brought into a form in which the entire thereof is wound around the surface of the housing 66.

As a modified example of the first example, when the first portion 62 remembers the extended state, the display device 100 wound around the housing 66 can be unwound. In this case, when an electric current is fed from the flexible printed board 12 to the wire 60, the first portion 62 is heated by Joule heat. Since the first portion 62 remembers the extended state, the first portion 62 is unwound by heat from the bent state. With this configuration, the display device 100 folded or rolled can be brought into a usable state by unwinding the display device 100.

In this modified example, the wires 60 (FIG. 4) are energized and heated in descending order of distance of the positions of the first portions 62 from the edge 10a (see FIG. 1) of the flexible substrate 10. For example, in the state shown in FIG. 7D, the wire 60 of the group G3 (see FIG. 4) whose first portions 62 are farthest from the edge 10a of the flexible substrate 10 is energized and heated to deform the display device 100 into the state of FIG. 7C. Then, the wire 60 of the group G2 (see FIG. 4) is energized and heated, the wire 60 of the group G1 (see FIG. 4) is energized and heated, and finally, the display device 100 can be unwound as shown in FIG. 7A.

Figure 8A:
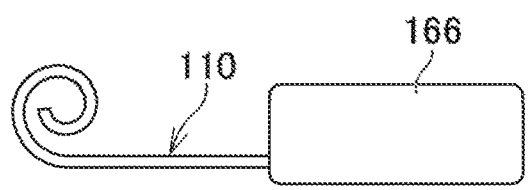
FIGS. 8A and 8B are diagrams for explaining a second example of the shape change of a display device according to an embodiment of the invention.
Figure 8B:
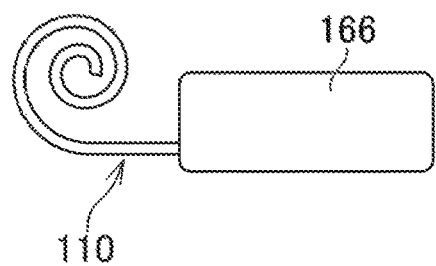

FIGS. 8A and 8B are diagrams for explaining a second example of the shape change of a display device according to an embodiment of the invention. This example differs from the first example in that the plurality of wires 60 (FIG. 4) are energized and heated in descending order of distance of the positions of the first portions 62 from the edge 10a (see FIG. 1) of the flexible substrate 10 in the first direction D1. The first portion 62 remembers the bent state, which is the same as in the first example. As shown in FIG. 8A, when the wire 60 of the group G3 (see FIG. 4) whose first portions 62 are farthest from the edge 10a of the flexible substrate 10 is energized and heated, a distal edge of the flexible substrate 10 on the side opposite to a housing 166 is bent. Then, a display device 110 can be wound by energizing and heating the wire 60 whose first portions 62 are close to the edge 10a (see FIG. 1) of the flexible substrate 10.

As a modified example of the second example, when the first portion 62 remembers the extended state, the display device 110 wound can be unwound by energizing and heating the plurality of wires 60 in order from FIG. 8B to FIG. 8A, reversed from the above description.

[Second Embodiment]

Figure 9:
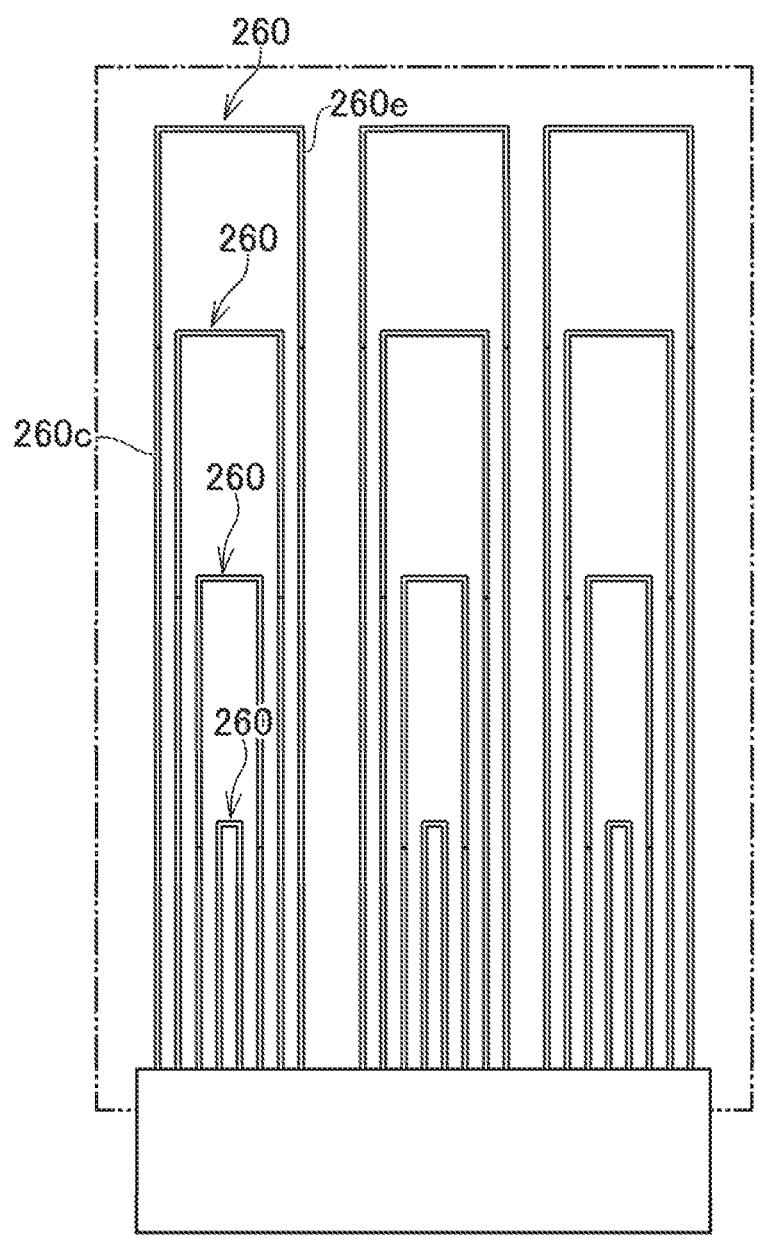
FIG. 9 is a plan view of a display device according to a second embodiment of the invention.

FIG. 9 is a plan view of a display device according to a second embodiment to which the invention is applied. In the embodiment, between an outbound portion 260c and an inbound portion 260e of a wire 260 of any group, a wire 260 of another group is located. In other words, a plurality of wires 260 included in different groups are inwardly or outwardly arranged in parallel with each other. One or a plurality of wires 260 are disposed inside the wire 260 disposed on the outermost side. The details described in the first embodiment apply to other details of the second embodiment.

[Third Embodiment]

Figure 10:
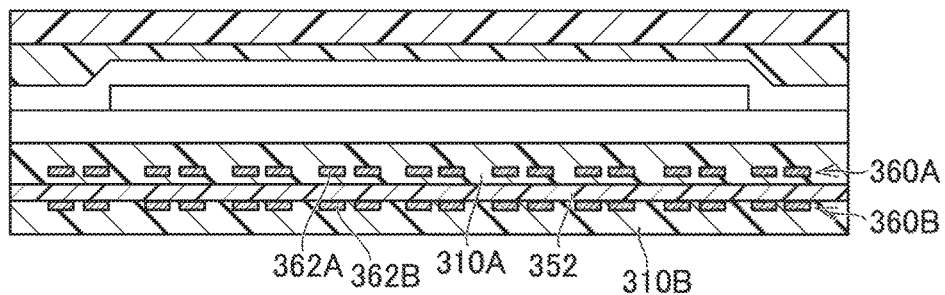
FIG. 10 is a plan view of a display device according to a third embodiment of the invention.

FIG. 10 is a plan view of a display device according to a third embodiment to which the invention is applied. In the embodiment, a second flexible substrate 310B is attached to a first flexible substrate 310A via an adhesive layer 352. A plurality of first wires 360A are provided within the first flexible substrate 310A or at an interface between the first flexible substrate 310A and an adjacent layer (within the first flexible substrate 310A in FIG. 10). A plurality of second wires 360B are provided within the second flexible substrate 310B or at an interface between the second flexible substrate 310B and an adjacent layer (at the interface in FIG. 10). A first portion 362A of each of the plurality of first wires 360A remembers the extended state. A first portion 362B of each of the plurality of second wires 360B remembers the bent state. According to the embodiment, both actions for storage and development of the display device can be electrically performed. The details described in the first embodiment apply to other details of the third embodiment.

The display device is not limited to an organic electroluminescent display device but may be a display device including a light-emitting element such as a quantum-dot light-emitting element (quantum-dot light-emitting diode (QLED)) in each pixel.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
    a first flexible substrate which has a first side, a second side, a third side, and a fourth side in a plan view, the first flexible substrate including a display region and a peripheral region surrounding the display region in the plan view, each of a first length of the first side and a third length of the third side being smaller than each of a second length of the second side and a fourth length of the fourth side;
    pixels arranged on the display region;
    a first wiring which is arranged inside the first flexible substrate, the first wiring including a first extending portion extending in a first direction and a first turn back portion extending in a second direction opposite to the first direction, the first extending portion including a first portion and a second portion, the first turn back portion including a third portion and a fourth portion, one end of the first portion connected to one end of the second portion, another end of the second portion connected to one end of the third portion, another end of the third portion connected to one end of the fourth portion, each of the second and third portions exhibiting a first shape-memory-effect; and
    a second wiring which is arranged inside the first flexible substrate, the second wiring including a second extending portion extending in the first direction and a second turn back portion extending in the second direction, one end of the second extending portion connected to one end of the second turn back portion, each of the second extending portion and the second turn back portion exhibiting a second shape-memory-effect, wherein
    each of the first side and the third side extends in a third direction perpendicular to the first direction and the second direction,
    each of the second side and the fourth side extends in the first direction,
    a part of each of the second and third portions overlaps with a part of each of the second extending portion and the second turn back portion as seen from the third direction, and
    another part of each of the second and third portions overlaps with no part of each of the second extending portion and the second turn back portion as seen from the third direction.

2. The display device according to claim 1, further comprising:
    a circuit board connected to the peripheral region between the display region and the first side, wherein
    another end of the first portion, another end of the fourth portion, another end of the second extending portion, and another end of the second turn back portion are connected to the circuit board.

3. The display device according to claim 1, wherein each of the pixels includes an organic emitting element and a thin film transistor connected to the organic emitting element.

4. The display device according to claim 1, further comprising:
    a second flexible substrate underlying the first flexible substrate;
    a third wiring which is arranged between the first flexible substrate and the second flexible substrate, the third wiring including a third extending portion extending in the first direction and a third turn back portion extending in the second direction, the third extending portion including a fifth portion and a sixth portion, the third turn back portion including a seventh portion and a eighth portion, one end of the fifth portion connected to one end of the sixth portion, another end of the sixth portion connected to one end of the seventh portion, another end of the seventh portion connected to one end of the eighth portion, each of the sixth and seventh portions exhibiting a third shape-memory-effect; and
    a fourth wiring which is arranged between the first flexible substrate and the second. flexible substrate and includes a fourth extending portion extending in the first direction and a fourth turn back portion extending in the second direction, one end of the fourth extending portion connected to one end of the fourth turn back portion, each of the fourth extending portion and the fourth turn back portion exhibiting a fourth shape-memory-effect, wherein
    a part of each of the sixth and seventh portions overlaps with a part of each of the fourth extending portion and the fourth turn back portion as seen from the third direction,
    another part of each of the sixth and seventh portions overlaps with no part of each of the fourth extending portion and the fourth turn back portion as seen from the third direction,
    the first shape-memory-effect memories a first shape,
    the second shape-memory-effect memories a second shape,
    the third shape-memory-effect memories a third shape,
    the fourth shape-memory-effect memories a fourth shape,
    the first shape is a first curved shape,
    the second shape is a second curved shape, and each of the third shape and the fourth shape is less curved than each of the first shape and the second shape.

\* \* \* \* \*